US012435418B2

(12) United States Patent
Shankarnarayana et al.

(10) Patent No.: US 12,435,418 B2
(45) Date of Patent: Oct. 7, 2025

(54) REMOVABLE SHOWERHEAD FACEPLATE FOR SEMICONDUCTOR PROCESSING TOOLS

(71) Applicant: Lam Research Corporation, Fremont, CA (US)

(72) Inventors: Manjesh Shankarnarayana, Bangalore (IN); Bin Luo, Beaverton, OR (US); Eric H. Lenz, Livermore, CA (US)

(73) Assignee: Lam Research Corporation, Fremont, CA (US)

( * ) Notice: Subject to any disclaimer, the term of this patent is extended or adjusted under 35 U.S.C. 154(b) by 374 days.

(21) Appl. No.: 18/000,635

(22) PCT Filed: Jun. 4, 2021

(86) PCT No.: PCT/US2021/035812
§ 371 (c)(1),
(2) Date: Dec. 2, 2022

(87) PCT Pub. No.: WO2021/247946
PCT Pub. Date: Dec. 9, 2021

(65) Prior Publication Data
US 2023/0279547 A1 Sep. 7, 2023

(30) Foreign Application Priority Data
Jun. 6, 2020 (IN) .............................. 202031023844

(51) Int. Cl.
*C23C 16/40* (2006.01)
*C23C 16/455* (2006.01)

(52) U.S. Cl.
CPC .............................. *C23C 16/45565* (2013.01)

(58) Field of Classification Search
CPC ......... C23C 16/45565; C23C 16/45561; H01J 37/32605; H01J 37/3244; H01J 37/32449
USPC ........................ 118/715; 156/345.33, 345.34
See application file for complete search history.

(56) References Cited

U.S. PATENT DOCUMENTS

| | | | |
|---|---|---|---|
| 2,146,448 | A | 2/1939 | Scott et al. |
| 2,405,693 | A | 8/1946 | Hamill et al. |
| 3,816,976 | A | 6/1974 | Stork et al. |
| 4,010,777 | A | 3/1977 | Mogensen |
| 4,140,735 | A | 2/1979 | Schumacher |
| 4,274,841 | A | 6/1981 | Andresen et al. |
| 4,863,493 | A | 9/1989 | Kotani et al. |
| 5,222,549 | A | 6/1993 | Ishii et al. |
| 5,562,952 | A | 10/1996 | Nakahigashi et al. |

(Continued)

FOREIGN PATENT DOCUMENTS

| | | |
|---|---|---|
| JP | H10298768 A | 11/1998 |
| JP | 2002129338 A | 5/2002 |

(Continued)

OTHER PUBLICATIONS

File history dated Jul. 25, 2013 for U.S. Appl. No. 13/950,647.

(Continued)

*Primary Examiner* — Rudy Zervigon
(74) *Attorney, Agent, or Firm* — Weaver Austin Villeneuve & Sampson LLP

(57) ABSTRACT

Showerheads for semiconductor processing operations are disclosed that have removable faceplates and various features that provide additional benefit in the context of removable faceplates.

17 Claims, 6 Drawing Sheets

(56) References Cited

U.S. PATENT DOCUMENTS

| | | | |
|---|---|---|---|
| 6,006,797 A | | 12/1999 | Bulow et al. |
| 6,063,233 A | * | 5/2000 | Collins ............. H01J 37/32467 |
| | | | 118/724 |
| 6,074,512 A | * | 6/2000 | Collins ............. H01J 37/32467 |
| | | | 204/298.37 |
| 6,095,083 A | * | 8/2000 | Rice .................. H01J 37/32165 |
| | | | 118/724 |
| 6,403,491 B1 | * | 6/2002 | Liu .................... H01L 21/76802 |
| | | | 257/E21.507 |
| 6,412,437 B1 | | 7/2002 | Campbell et al. |
| 6,514,376 B1 | * | 2/2003 | Collins ............. H01J 37/32165 |
| | | | 118/724 |
| 6,984,591 B1 | | 1/2006 | Buchanan et al. |
| 7,323,401 B2 | | 1/2008 | Ramaswamy et al. |
| 7,820,556 B2 | | 10/2010 | Hsu et al. |
| 7,955,990 B2 | | 6/2011 | Henri et al. |
| 9,334,566 B2 | | 5/2016 | Chandrasekharan et al. |
| 10,094,018 B2 | | 10/2018 | Kumar et al. |
| 2002/0192375 A1 | | 12/2002 | Sun et al. |
| 2003/0037880 A1 | * | 2/2003 | Carducci ........... H01L 21/68785 |
| | | | 257/E21.507 |
| 2003/0038111 A1 | * | 2/2003 | Carducci ........... H01L 21/68785 |
| | | | 257/E21.507 |
| 2005/0066893 A1 | | 3/2005 | Soininen |
| 2008/0089001 A1 | * | 4/2008 | Parkhe ................ H01L 21/6831 |
| | | | 279/128 |
| 2008/0211118 A1 | | 9/2008 | Wyse et al. |
| 2008/0242912 A1 | | 10/2008 | Letessier et al. |
| 2008/0264803 A1 | | 10/2008 | Agrawal |
| 2009/0182180 A1 | | 7/2009 | Huang et al. |
| 2014/0026977 A1 | | 1/2014 | Kimmerle et al. |
| 2014/0029374 A1 | | 1/2014 | Kimmerle et al. |
| 2014/0235069 A1 | | 8/2014 | Breiling et al. |
| 2015/0145154 A1 | | 5/2015 | Chandrasekharan et al. |
| 2016/0052651 A1 | | 2/2016 | Nguyen et al. |
| 2016/0052655 A1 | | 2/2016 | Nguyen et al. |
| 2016/0086776 A1 | | 3/2016 | De La Llera et al. |
| 2018/0334744 A1 | | 11/2018 | Woelk et al. |
| 2019/0024233 A1 | | 1/2019 | Kumar et al. |
| 2019/0211449 A1 | | 7/2019 | Isobe et al. |
| 2023/0257878 A1 | | 8/2023 | Chandrasekharan et al. |

FOREIGN PATENT DOCUMENTS

| | | |
|---|---|---|
| JP | 2008227064 A | 9/2008 |
| JP | 2009226277 A | 10/2009 |
| JP | 2012195595 A | 10/2012 |
| JP | 2014220231 A | 11/2014 |
| JP | 2016046524 A | 4/2016 |
| JP | 2017100897 A | 6/2017 |
| KR | 20070113398 A | 11/2007 |
| KR | 20160136238 A | 11/2016 |
| WO | WO-2014018740 A1 | 1/2014 |
| WO | WO-2014022219 A1 | 2/2014 |
| WO | WO-2020023854 A1 | 1/2020 |

OTHER PUBLICATIONS

File History dated Jul. 26, 2013 for U.S. Appl. No. 13/951,513.
International Preliminary Report on Patentability dated Feb. 9, 2023 in PCT Application No. PCT/US2021/042648.
International Preliminary Report on Patentability dated Sep. 22, 2022, in PCT Application No. PCT/US2021/022162.
International Search Report and Written Opinion dated Jul. 7, 2021 in PCT Application No. PCT/US2021/022162.
International Search Report and Written Opinion dated Nov. 3, 2021, in PCT Application No. PCT/US2021/042648.
U.S. Final Office Action dated Apr. 19, 2012 in U.S. Appl. No. 12/786,842.
US Final Office Action, dated Dec. 21, 2009, issued in U.S. Appl. No. 12/133,223.
U.S. Non-Final Office Action dated Aug. 19, 2009 in U.S. Appl. No. 12/133,223.
U.S. Non-Final Office Action dated Jun. 18, 2024 in U.S. Appl. No. 18/001,587.
U.S. Non-Final Office Action dated Nov. 9, 2011 in U.S. Appl. No. 12/786,842.
U.S. Notice of Allowance dated Jul. 20, 2012 in U.S. Appl. No. 12/786,842.
US Notice of Allowance, dated Mar. 2, 2010, issued in U.S. Appl. No. 12/133,223.
US Notice of Allowance, dated Nov. 2, 2010, issued in U.S. Appl. No. 12/334,220.
U.S. Notice of Allowance dated Sep. 28, 2024 in U.S. Appl. No. 18/001,587.
US Office Action, dated Aug. 19, 2009, issued in U.S. Appl. No. 12/133,223.
U.S. Restriction Requirement dated Aug. 5, 2010 in U.S. Appl. No. 12/334,220.
US Supplemental Notice of Allowance, dated Feb. 8, 2011, issued in U.S. Appl. No. 12/334,220.
International Preliminary Report on Patentability dated Dec. 15, 2022, in PCT Application PCT/US2021/035812.
International Search Report and Written Opinion dated Sep. 27, 2021 in Application No. PCT/US2021/035812.
JP Office Action dated Jan. 28, 2025 in JP Application No. 2022-574767, with English Translation.
Kumar S.S., et al., "Influence of Flatness and Waviness of Rough Surfaces on Surface Contact Conductance," Journal of Heat Transfer, 2003, vol. 125, pp. 394-402.

* cited by examiner

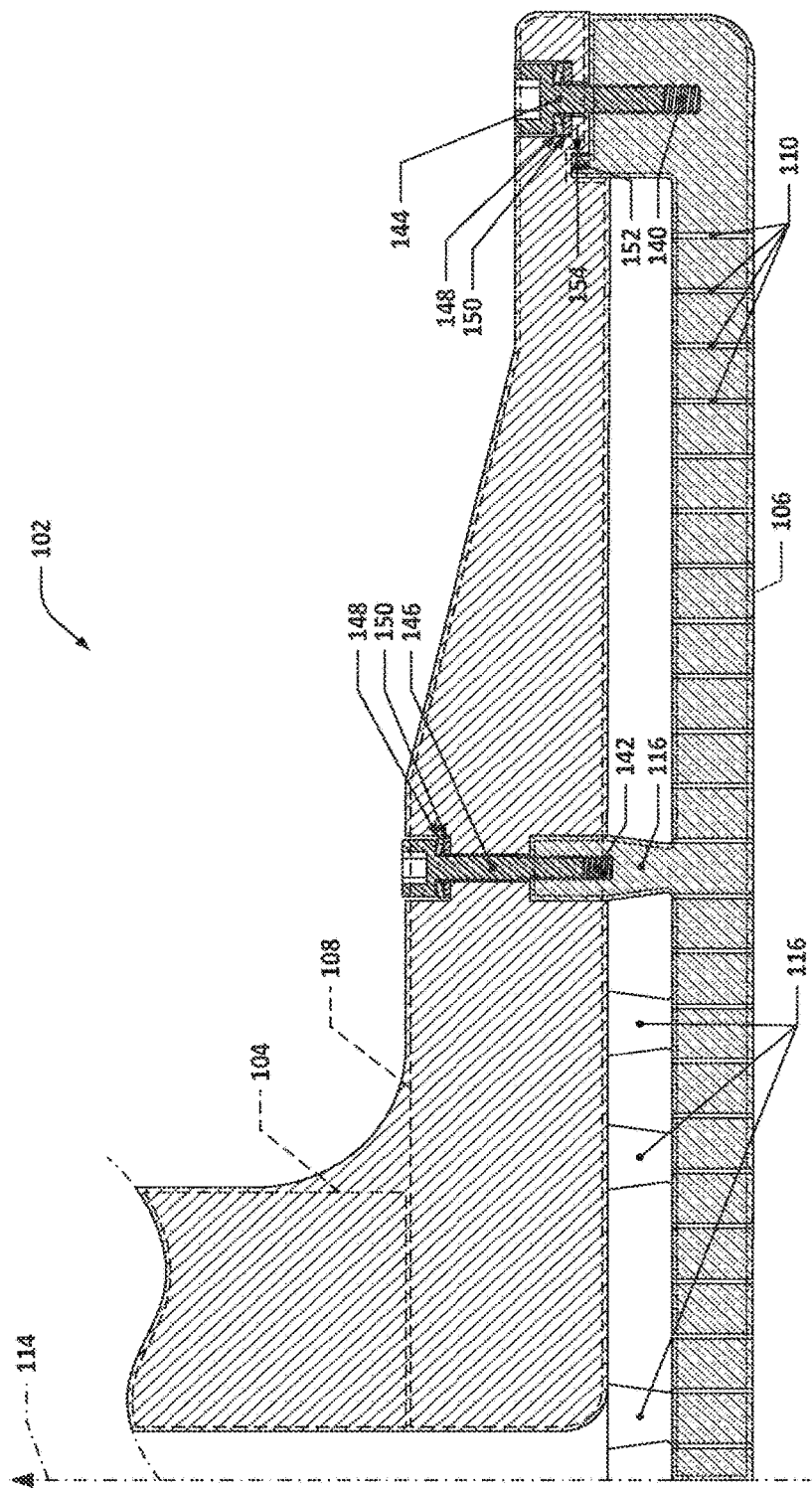
Figure 1
Figure 1'
Figure 1"

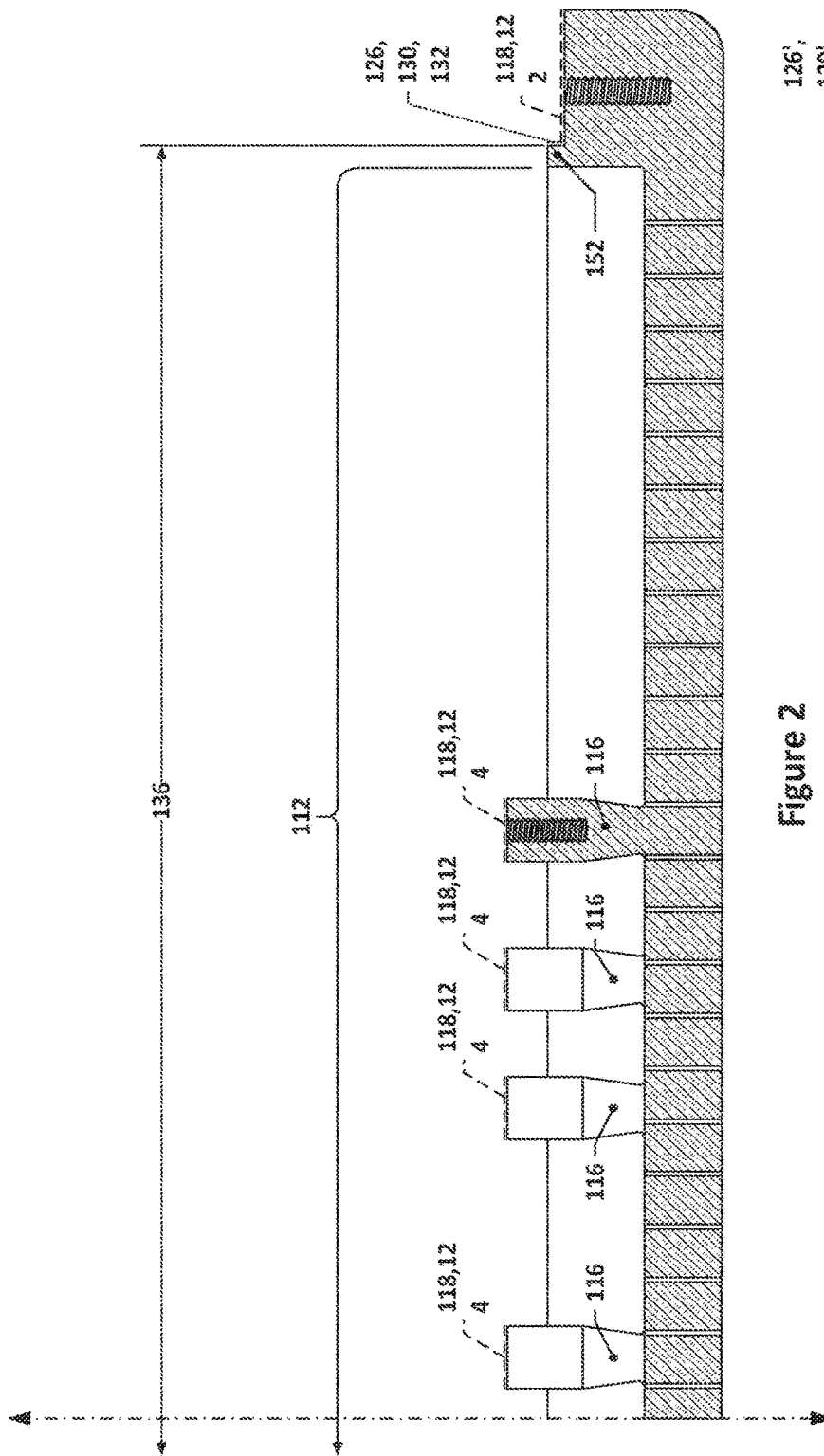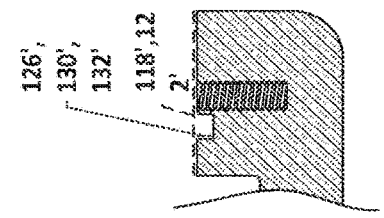

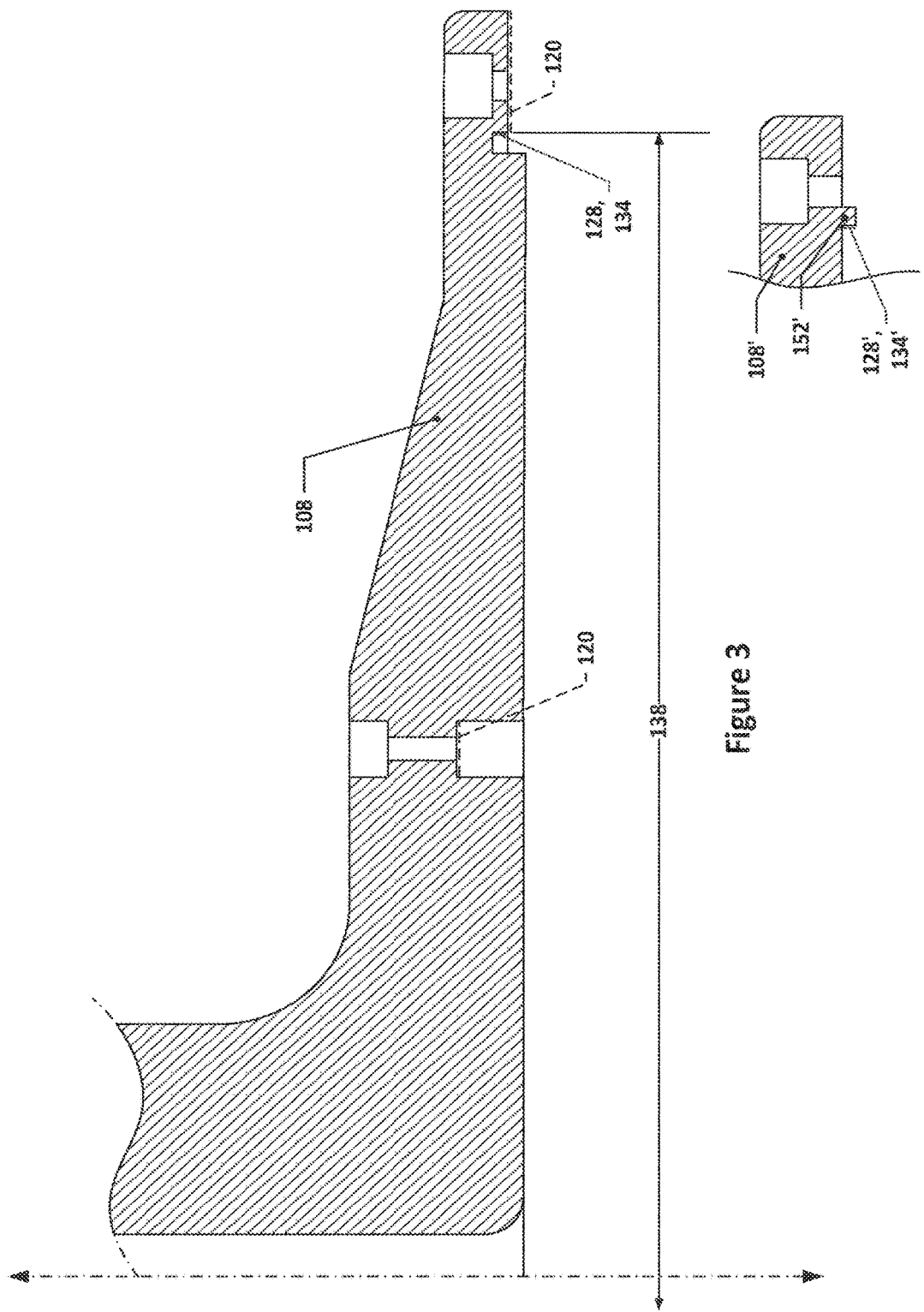

REMOVABLE SHOWERHEAD FACEPLATE FOR SEMICONDUCTOR PROCESSING TOOLS

RELATED APPLICATIONS

A PCT Request Form is filed concurrently with this specification as part of the present application. Each application that the present application claims benefit of or priority to as identified in the concurrently filed PCT Request Form is incorporated by reference herein in its entirety and for all purposes.

BACKGROUND

Semiconductor processing tools commonly use a "showerhead" to distribute semiconductor processing gases across a substrate or wafer that is supported within a semiconductor processing chamber by a pedestal or chuck. Showerheads typically feature a large number of gas distribution ports that are distributed across the underside of the showerhead and through which processing gases are flowed during semiconductor processing operations. There are two general classes of showerheads used in semiconductor processing tools—"chandelier" type showerheads and "flush-mount" showerheads. Chandelier-type showerheads typically include a disk-like structure housing the gas distribution ports, one or more internal plenums for distributing processing gases to those gas distribution ports, and a stem that connects to or extends from a top side of the disk-like structure and up to or through a ceiling of the processing chamber in which the chandelier-type showerhead is located. The stem supports the disk-like structure within the processing chamber and also acts to route processing gases to the plenum(s) within the disk-like structure. A flush-mount showerhead does not have a stem or equivalent structure, and instead is simply mounted to the walls of the semiconductor processing chamber, often, in effect, acting as the lid to the semiconductor processing chamber.

Presented herein is a design for a removable faceplate for a semiconductor processing showerhead.

SUMMARY

Details of one or more implementations of the subject matter described in this specification are set forth in the accompanying drawings and the description below. Other features, aspects, and advantages will become apparent from the description, the drawings, and the claims.

The present inventors conceived of a semiconductor processing showerhead that featured a removable showerhead faceplate. A typical semiconductor processing showerhead will, over time, degrade due to exposure to the harsh environments found within the semiconductor processing chamber within which it is mounted. Such degradation, in some cases, can be remedied through a cleaning process—for example, showerheads that are used in a deposition environment may experience degradation in the form of having deposition occur on surfaces of the showerhead, which may cause constriction of the gas distribution ports or changes in the profile of the underside of the showerhead facing the wafer which may affect wafer processing uniformity. In such a case, the showerhead in question may be removed and cleaned/refurbished to remove such undesired build-up and then subsequently reinstalled on the semiconductor processing tool (or another similar tool). In other cases, however, the degradation may be due to erosion of the faceplate, e.g., such as may be experienced in an etching process. In such cases, the showerhead may simply require removal and replacement.

In either case, the entire showerhead is typically removed from the processing chamber in which it is housed before being replaced, the process of which takes time during which the chamber cannot be used for revenue-generating operations. Additionally, such replacement can be extremely costly—a new showerhead is a high-cost part, and even in cases where a showerhead is simply refurbished or cleaned, such refurbishment or cleaning and can also incur significant costs. To reduce equipment down time and the cost to operate semiconductor processing equipment using showerheads, the present inventors conceived of an easily installable removable showerhead faceplate that may be configured to provide good thermal performance, resistance to sagging, and/or a low rate of gas leakage at the interface between the removable showerhead faceplate and the portions of the showerhead to which it mounts.

In particular, the present inventors conceived of the showerhead faceplates discussed herein while designing a showerhead for use at relatively high operating temperatures, e.g., in the 250° C. to 350° C. range; various features described below may thus provide particular usefulness in showerheads for use in elevated temperature environments, although may also be useful in showerheads for use in more or less extreme temperature environments.

In some implementations, an apparatus may be provided that includes, or is, a showerhead faceplate. The showerhead faceplate may be configured to removably mate with a showerhead backplate and may have a plate region having a plurality of gas distribution ports located therein. Each gas distribution port may extend through the showerhead faceplate, and the showerhead faceplate may include one or more first planar thermal contact surfaces, and each first planar thermal contact surface may be configured to contact a corresponding second planar thermal contact surface on the showerhead backplate when the showerhead faceplate is mated to the showerhead backplate. The one or more first planar thermal contact surfaces may include an annular planar thermal contact surface that has an outer diameter of between 12" and 18" and that encircles the plate region when viewed along a first axis that is perpendicular to the annular planar thermal contact surface, and the annular planar thermal contact surface may have a flatness less than or equal to a value between 800 μin and 1200 μin and a surface roughness Ra less than or equal to a value between 24 μin to 40 μin.

In some implementations, the apparatus may further include a plurality of posts located within the plate region and extending away from the plate region. The one or more first planar thermal contact surfaces may include, for each of the posts, an endpost thermal contact surface that is parallel to the annular planar thermal contact surface.

In some such implementations, the first planar thermal contact surfaces may have flatness values less than or equal to 1000 μin and average surface roughness Ra greater than or equal to 24 μin. In some other such implementations, the first planar thermal contact surfaces may have flatness values less than or equal to 1000 μin and average surface roughness Ra greater than or equal to 30 μin, and in yet other such implementations, the first planar thermal contact surfaces may have flatness values less than or equal to 1000 μin and average surface roughness Ra greater than or equal to 40 μin.

In some implementations of the apparatus, the showerhead faceplate may be made of an aluminum alloy.

In some implementations of the apparatus, the showerhead faceplate may include a plurality of first threaded holes distributed around the plate region and located in the annular planar thermal contact surface. In some such implementations, the first threaded holes may be arranged in a circular array with an angular spacing of at most 20° in between adjacent first threaded holes.

In some implementations, of the apparatus, the showerhead faceplate may further include a first thermal interference fit feature that is configured to interface with a second thermal interference fit feature on the showerhead backplate when the showerhead faceplate is mated to the showerhead backplate, the first thermal interference fit feature may include a first axially symmetric surface that faces radially outwards and is located in between the plate region and the first threaded holes, and the first axially symmetric surface may have a first cross-sectional profile that is dimensioned so as to be within 0.01" to 0.014" of a corresponding second cross-sectional profile of the second thermal interference fit feature on the showerhead backplate when the showerhead faceplate is mated to the showerhead backplate such that the showerhead faceplate is centered with respect to the showerhead backplate and the showerhead faceplate and the showerhead backplate are both at 20° C.

In some such implementations of the apparatus, the first thermal interference fit feature may be a first cylindrical surface having a first diameter, the second thermal interference fit feature on the showerhead backplate with which the first thermal interference fit feature may be configured to interface when the showerhead faceplate is mounted to the showerhead backplate is a second cylindrical surface having a second diameter, and the first diameter may be smaller than the second diameter and within 0.02" of the second diameter when the showerhead faceplate and the showerhead backplate are both at 20° C.

In some further such implementations of the apparatus, the showerhead faceplate may include an inner wall that extends around the plate region and is interposed between the first threaded holes and the plate region, the inner wall may extend away from the annular planar thermal contact surface, and the first thermal interference fit feature may be provided by an outward-facing surface of the inner wall.

In some implementations of the apparatus, the apparatus may further include a plurality of first threaded fasteners equal in number to the number of first threaded holes, a plurality of washers at least equal in number to the number of first threaded holes, and a plurality of conical spring washers at least equal in number to the number of first threaded holes. In such implementations, the apparatus may be a kit configured to facilitate replacement of an expired showerhead faceplate attached to the showerhead backplate of a semiconductor processing tool.

In some such implementations, the showerhead faceplate may be made of a first material, the first threaded fasteners may be made of a second material, the conical spring washers may be made of a first alloy, and the washers may be made of a second alloy. The first material and the second material may each be an aluminum alloy, 6061-T6 aluminum alloy, or alumina, and the first alloy and the second alloy may be made of a nickel alloy, an aluminum alloy, or a 6061-T6 aluminum alloy. The second material may be the same as or different from the first material and the second alloy may be the same as or different from the first alloy.

In some implementations, the apparatus may further include the showerhead backplate having a plurality of through-holes equal in number to the number of first threaded holes, a plurality of first threaded fasteners equal in number to the number of first threaded holes, a plurality of washers at least equal in number to the number of first threaded holes, and a plurality of conical spring washers at least equal in number to the number of first threaded holes. Each first threaded fastener of the plurality of first threaded fasteners may be inserted through at least one of the washers, one of the conical spring washers, one of the through-holes, and screwed into a corresponding one of the first threaded holes, and at least one washer may be interposed between each of the conical spring washers and the showerhead backplate.

In some such implementations, one or more of the through-holes in the showerhead backplate may be threaded holes having an inner thread diameter large enough that the first threaded fastener inserted therethrough is able to be inserted therethrough without engagement of the threads of the first threaded fastener with the threads of the threaded hole.

In some implementations of the apparatus, the showerhead faceplate may be made of a first material, the showerhead backplate may be made of a second material, the threaded fasteners may be made of a third material, the conical spring washers may be made of a first alloy, and the washers may be made of a second alloy. In such implementations, the first material, the second material, and the third material may each be an aluminum alloy, a 6061-T6 aluminum alloy, or alumina, and the first alloy and the second alloy may each be a nickel alloy, an aluminum alloy, or a 6061-T6 aluminum alloy. Each of the first, second and third materials may be the same materials, different materials, or a mix of same and different materials. Similarly, the first and second alloys may be the same or different from each other.

In some implementations, each first fastener may be torqued to between 6 inch-pounds and 8 inch-pounds.

BRIEF DESCRIPTION OF THE DRAWINGS

FIG. 1 depicts a section view of half of an example showerhead for use in semiconductor processing systems; the example showerhead is generally symmetric about a center axis.

FIG. 1' depicts a plan view of a region of a showerhead faceplate showing a pattern of gas distribution holes and a post.

FIG. 1" depicts a detail view of an alternate showerhead backplate/showerhead faceplate edge interface.

FIG. 2 depicts a section view of half of an example showerhead faceplate similar to that shown in FIG. 1.

FIG. 2' depicts a detail view of an alternate showerhead faceplate having a different thermal interference fit feature.

FIG. 3 depicts a section view of half of an example showerhead backplate and stem similar to that shown in FIG. 1.

FIG. 3' depicts a detail view of an alternate showerhead backplate having a different thermal interference fit feature.

DETAILED DESCRIPTION

Figure 4:
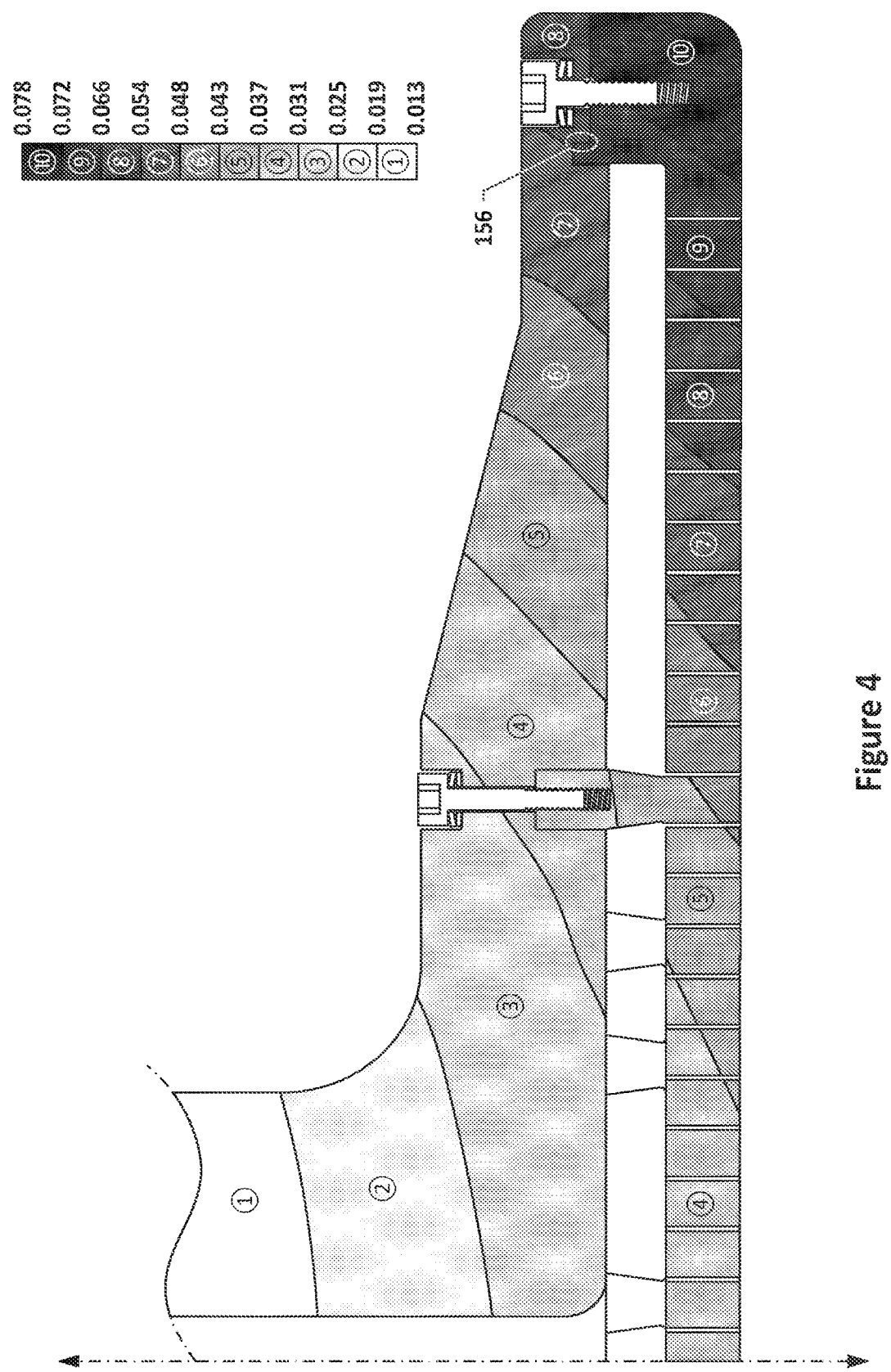
FIG. 4 depicts the example showerhead of FIG. 1 with a thermal displacement map showing thermal displacement effects at an elevated process temperature.

As discussed above, the removable showerhead faceplate systems discussed herein may be particularly useful for high-temperature semiconductor processing applications, e.g., applications in which the showerhead faceplate may reach temperatures of 250° C. to 350° C., although it will be recognized that such systems may be used in other semiconductor processing contexts as well with appropriate modification, including in higher- and lower-temperature contexts.

FIG. 1 depicts a section view of half of an example showerhead for use in semiconductor processing systems; the example showerhead is generally symmetric about a center axis. In FIG. 1, showerhead 100 features a stem 104 that is connected at one end to a showerhead backplate 108; the other end (not shown) of the stem 104 may be interfaced with a ceiling or lid of a semiconductor processing chamber. As shown, the stem 104 and the showerhead backplate 108 are provided by a combined component, although it will be understood that such features may be provided by more than one component assembled together into an assembly. Generally speaking, the stem may be a structural member that is much smaller in diameter or width than the outer diameter or width of the showerhead backplate 108. In this example, the stem 104 includes a central passage, centered on a first axis 114, through which processing gases may be delivered to the showerhead 102. The first axis 114 may be generally normal to the underside of the showerhead faceplate 106 and/or the first thermal contact surfaces (discussed later). The components of the showerhead 102 discussed up until now with reference to FIG. 1 are all intended to be generally permanently mounted within a semiconductor processing chamber (or intended to at least remain within the semiconductor processing chamber during a period of time that spans multiple replacements of the showerhead faceplate). It will be understood that while the present examples are directed at chandelier-type showerheads with removable faceplates, flush-mount showerheads may be design according to similar principles, may include analogous features, and are considered within the scope of this disclosure as well.

The showerhead 102 may also include a removable showerhead faceplate 106 that features a plurality of gas distribution ports 110 extending therethrough. In the depicted example, the showerhead faceplate 106 may be clamped against the showerhead backplate 108 through the clamping force provided by a plurality of fasteners, e.g., first threaded fasteners 144 and second threaded fasteners 146 (e.g., socket-head cap screws). In the depicted example, each threaded fastener 144 or 146 is paired with a corresponding conical spring washer 148 and a washer 150, although the sizes of each conical spring washer 148 and 150 may be selected to be different depending on the desired clamping force. The first threaded fasteners 144 may each be inserted through a corresponding hole in the showerhead backplate 108 and threaded into a first threaded hole 140 in the showerhead faceplate 106. Similarly, the second threaded fasteners 146 may be inserted through corresponding holes in the showerhead backplate 108 and threaded into second threaded holes 142.

In the depicted example showerhead 102, the second threaded holes 142 are each located at the end of a corresponding post 116 that protrudes upward from a surface of the showerhead faceplate 106 and towards the showerhead backplate 108. In some implementations, such as the one depicted, the posts 116, if used, may be tapered or otherwise caused to undergo a reduction in cross-sectional area in a plane that is perpendicular to the first axis 114 before reaching the surface of the showerhead faceplate 106 from which each post 116 extends. In such implementations, this may permit the spacing between gas distribution ports 110 to be smaller than the diameter or cross-sectional width of the posts 116 where those posts 116 interface with the showerhead backplate 108, thereby permitting for increased thermal contact between the posts 116 and the showerhead backplate 108 as well as increased material in the region of the second threaded holes 142 that may strengthen the threaded interface in that region without materially impacting the spacing of the gas distribution ports 110, e.g., the increased diameter of the posts 116 may be used to house threaded inserts that may provide a stronger threaded joint than what may be achieved using only the post material for the threaded joint (as shown, no threaded inserts are depicted—but it is to be understood that threaded inserts, such as helical inserts (such as Helicoil™) may be used in such threaded holes). It is noted that, in FIG. 1, the cross-sectioning plane is through the center of the right-most post 116 and the center of the showerhead 102 and that the gas distribution ports 110 are shown in positions that may not actually be representative of their spacing in this plane. For example, if the gas distribution ports 110 are arranged across the showerhead faceplate in a triangular array, as shown in FIG. 1', each post 116 may be centered within a group of three adjacent gas distribution ports 110', with the outer edge 116' of that post 116 where the post 116 meets the surface of the showerhead faceplate 106 generally butting up against each of the three gas distribution ports 110'. In such a scenario, there would not be a sectioning plane that passes through the center of that post 116 and more than one of the three gas distribution ports 110' adjacent thereto.

In contrast, there are two gas distribution ports 110 shown directly adjacent to the right-most post 116 in FIG. 1. Such a configuration would not be possible with gas distribution ports 110 arranged in a triangular pattern as described above and with respect to FIG. 1' (although such a cross-sectional view could exist for a square pattern of gas distribution ports 110, which is also considered within the scope of this disclosure). It is therefore to be understood that the arrangement of gas distribution ports 110 shown is merely to provide an understanding that the gas distribution ports 110 are generally distributed across the underside of the showerhead 102 and is not representative of an actual cross-section of such a showerhead faceplate.

Another feature that is visible in FIG. 1 is the inclusion of an inner wall 152 that protrudes from a surface of the showerhead faceplate 106 and into a receiving groove in the showerhead backplate 108. As can be seen, there is a small gap 154 that is present between the outward-facing surface of the inner wall 152 and the inward-facing surface of the groove that receives the inner wall 152 in the showerhead backplate 108.

An alternate arrangement is shown in FIG. 1", in which an inner wall 152' is located on the showerhead backplate 108' and protrudes into a corresponding groove on the showerhead faceplate 106'; a gap 154' is formed between the inward-facing surface of the inner wall 152' and the outward-facing surface of the groove that receives the inner wall 152'.

The showerhead faceplate 106 may be easily removed from the showerhead backplate 108 through the simple expedient of removing the first threaded fasteners 144 and the second threaded fasteners 146 from the showerhead backplate and then, once the threaded fasteners have been removed, allowing the showerhead faceplate 106 to drop away from the showerhead backplate 108 and be moved out from underneath the showerhead backplate 108. A new showerhead faceplate 106 may then be installed. The various radial interfaces between the showerhead faceplate 106 and the showerhead backplate 108, e.g., the holes in the showerhead backplate 108 for receiving the posts 116 and the groove in the showerhead backplate 108 for receiving the inner wall 152, may be sized such that they are clearance fits at room temperature, thereby allowing the showerhead faceplate 106 to generally be free to fall away from the showerhead backplate 108 (at room temperature) once the support provided by the threaded fasteners 144 and 146 is removed.

During semiconductor processing operations, the showerhead 102 may absorb significant amounts of heat that result from the semiconductor manufacturing process being used. For example, a large amount of heat may be radiatively transferred to the showerhead 102 from a heated pedestal or chuck used to support the wafer during semiconductor processing operations. Additional heat may be absorbed by the showerhead 102 from, for example, a plasma generated in between the showerhead 102 and the wafer being processed 1; some of the heat delivered to the showerhead 102 may travel through the plenum space (and the gas located therewithin) to the showerhead backplate 108, while more of the heat delivered to the showerhead 102 may be conducted to the showerhead backplate 108 via conductive heat transfer through the posts 116 and about the perimeter of the showerhead faceplate 106 where the first threaded holes 140 are located. The heat may then flow through the showerhead backplate 108 in a generally inwards direction before flowing up the stem 104 and being transferred to the ambient environment (or the chamber housing and/or a cooling system).

In a conventional showerhead with a permanently attached showerhead faceplate, e.g., a showerhead faceplate that is welded or brazed into place, there is little or nor loss of heat transfer efficiency across the zones where the showerhead faceplate meets the showerhead backplate. The present inventors, however, realized that showerheads with removable faceplates, such as that shown in FIG. 1, may present particular challenges with respect to heat transfer. In particular, if there is poor heat transfer across the interface between the showerhead faceplate 106 and the showerhead backplate 108, this may prevent heat from flowing out of the showerhead faceplate 106 at a rate that is sufficient to maintain a desired operating temperature of the showerhead faceplate. For example, it may be desirable to maintain a showerhead faceplate temperature of between 200° C. and 250° C. with a temperature variation across the showerhead faceplate of no more than 15° C.; if the heat flow from the showerhead faceplate to the showerhead backplate is insufficient to prevent undesirable amounts of heat to build up in the showerhead faceplate 106, the temperature of the showerhead faceplate 106 may rise above the desired temperature for the particular semiconductor process being implemented, which may, in turn, increase potential outgassing from the metal of the showerhead faceplate 106 that may contaminate the wafer being processed. Additionally, the higher temperature in the showerhead faceplate may result in a larger temperature differential between the showerhead faceplate 106 and the showerhead backplate 108, which may, in turn, result in greater 11 thermal expansion of the showerhead faceplate 106 relative to the showerhead backplate 108, which may lead to undesired deformation of the showerhead faceplate 106.

In order to provide for more effective heat transfer between the showerhead faceplate 106 and the showerhead backplate 108, removable showerhead faceplates such as that shown in FIG. 1 may feature various planar thermal contact surfaces that are configured to contact corresponding planar thermal contact surfaces located on the showerhead backplate 108 when the showerhead faceplate 106 is installed on the showerhead 102.

FIG. 2 depicts a section view of half of an example showerhead faceplate similar to that shown in FIG. 1. In FIG. 2, the showerhead faceplate 106 is shown removed from the showerhead backplate 108. The showerhead faceplate 106 may have a plurality of first thermal contact surfaces 118, which may include, for example, endpost thermal contact surfaces 124 and an annular thermal contact surface 122. The first thermal contact surfaces 118 may all generally be parallel to one another, although, as can be seen, some such first thermal contact surfaces 118 may be at different elevations relative to each other. For ease of reference, the first thermal contact surfaces 118 are indicated by dashed lines that are vertically offset upwards somewhat from the actual first thermal contact surfaces 118. The endpost thermal contact surfaces 124 may, for example, be located at the ends of each post 116 where that post 116 is intended to contact the showerhead backplate 108, e.g., at the top ends of the posts 116. The posts 116 may be arranged in one or more generally circular patterns arranged around the first axis 114, and may provide for heat transfer paths from the showerhead faceplate 106 to the showerhead backplate 108, as well as structural support to the center portion of the showerhead faceplate 106 to prevent the center portion of the showerhead faceplate from, for example, sagging.

Additional or alternative heat transfer paths may be provided by the annular thermal contact surface 122, which may, for example, encircle a plate region 112 of the showerhead faceplate 106 when viewed along the first axis 114. The plate region 112 of the showerhead faceplate 106 may generally refer to the region of the showerhead faceplate 106 in which the gas distribution ports 110 are located and may extend, for example, from the center of the showerhead faceplate 106 to the inward-facing surface of the showerhead faceplate 106 that is defined by a wall or annular raised region of the showerhead faceplate 106 (or a similar surface on the showerhead backplate). The annular thermal contact surface 122 may, for example, be the topmost surface of the wall or annular raised region of the showerhead faceplate.

Some such planar thermal contact surfaces may have unusually low flatness specifications for features of such size. For example, the showerhead faceplate 106 may have a nominal diameter of approximately 15 inches, e.g., between 12 inches and 18 inches, and the annular thermal contact surface 122 of the showerhead faceplate 106 (which may have a similar outer diameter) may have a flatness that is kept, for example, to a value of between (or below) 800 μin and 1200 μin, e.g., 1000 μin, across the entire annular thermal contact surface 122. Similarly, the surface roughness of the thermal contact surfaces may be kept, for example, to values of (or below) 24 μin-30 μin Ra or 24 μin-40 μin Ra. It will be appreciated that such flatness tolerances are not typical for features of such size-especially for features that are intended to be clamped together.

In some implementations, the showerhead faceplate 106 may, in addition to including features to provide good thermal contact between the showerhead faceplate 106 and the showerhead backplate 108, include a first thermal interference fit feature 126. The first thermal interference fit feature 126 may be provided by a first axially symmetric surface 130 that is defined by a first cross-sectional profile 132. For example, the first axially symmetric surface 130 may be an outward-facing conical or cylindrical surface having a first diameter 136 and which is provided, for example, by the inner wall 152. As will be noted from FIG. 1″, other implementations may provide the first axially symmetric surface 130 via an outward-facing surface of a groove that may receive an inner wall feature located on the showerhead backplate 108.

FIG. 3 depicts a section view of half of an example showerhead backplate and stem similar to that shown in FIG. 1. As seen in FIG. 3, the showerhead backplate 108 may include second planar thermal contact surfaces 120, which may correspond in location to the first thermal contact surfaces 118 on the showerhead faceplate 106. The showerhead backplate 108 may also include a second thermal interference fit feature 128, which may have a second cross-sectional profile 134 that may define, for example, a second axially symmetric surface. FIG. 3′ depicts a detail view of an alternate showerhead backplate design, similar to that shown in FIG. 1″, in which a showerhead backplate 108′ may have an inner wall 152′ that provides an inward-facing second thermal interference fit feature 128, which may have a second cross-sectional profile 134′.

The dimensions of the showerhead faceplate 106 and the showerhead backplate 108 may be controlled such that the gap 154 exists (and defines a clearance fit or other fit that allows for easy removal of the showerhead faceplate 106) when the showerhead faceplate 106 and the showerhead backplate 108 are both at a nominal room temperature, e.g., 20° C., but decreases such that the gap closes to a transition fit or a mild interference fit when the showerhead 102 reaches steady state operating conditions. This acts to both center the showerhead faceplate 106 relative to the showerhead backplate 108 and to also establish a generally gas-tight seal between the showerhead backplate 108 and the showerhead faceplate 106 when the showerhead backplate 108 and the showerhead faceplate 106 are at steady state operating conditions. For example, at room temperature, a clearance gap of approximately 0.012″ may be provided, e.g., 0.009″ to 0.015″ or 0.010″ to 0.014″, which may completely disappear when the showerhead faceplate 106 reaches steady state operating temperature. For example, the gap may be reduced to zero or may turn into a compression interface, e.g., the gap may cause up to several thousandths, e.g., up to between about 0.005″ and 0.010″, of compression deformation to occur between the showerhead faceplate 106 and the showerhead backplate 108.

To better illustrate how such sealing effects are provided, reference is made to FIG. 4, which depicts the example showerhead of FIG. 1 with a thermal displacement map showing thermal displacement effects at an elevated process temperature. As can be seen in FIG. 4, the outer perimeter of the showerhead faceplate 106 experiences a greater amount of radial thermal displacement than the corresponding location in the showerhead backplate 108 due to increased temperature in the showerhead faceplate 106 as compared to the showerhead backplate 108. Thus, the inner wall 152, and the first axially symmetric surface 130, may generally experience more outward radial thermal displacement than the second axially symmetric surface of the groove in the showerhead backplate 108 that faces the first axially symmetric surface 130, thereby closing the gap 154. The temperature mismatches between the showerhead backplate 108 and the showerhead faceplate 106 thus produce thermal expansion mismatches that allow for the gap 154 to be closed between the showerhead faceplate 106 and the showerhead backplate 108 to produce an interference or transition fit 156 even when the showerhead faceplate 106 and the showerhead backplate 108 are made of materials of similar thermal expansion characteristics. For example, for a showerhead backplate 108 and a showerhead faceplate 106 that are both made of an aluminum alloy, e.g., 6061-T6 aluminum, the gap 154 between the first axially symmetric surface 130 and the second axially symmetric surface may be on the order of 0.01″ when the showerhead 102 is at room temperature. Put another way, the difference between the first diameter 136 and the second diameter 138 may be on the order of 0.02″ when the showerhead is at room temperature, but may close to 0″ when heated to a temperature of between 280° C. and 320° C.

Removable showerhead faceplates such as those discussed herein may also include features that are designed to address potential complications that may occur during use. For example, for showerhead faceplates and backplates that are made of aluminum alloy, various complications may arise that may interfere with the use of fastener systems that may be used to attach the showerhead faceplate to the showerhead backplate. For example, if a different material is used for the fasteners, e.g., stainless steel or Inconel, than for the showerhead backplate 108 and the showerhead faceplate 106, this may cause loosening of the threaded connections during thermal cycling. For example, if stainless steel threaded fasteners are used, the differing thermal expansion characteristics of the stainless steel of the fasteners and the aluminum alloy of the showerhead components may result in the stainless steel fasteners expanding to a much lower extent than the aluminum components. This may cause the preload in such fasteners to increase when heated to operating conditions, which may, in turn, cause permanent localized deformation in the aluminum components such that when the showerhead is cooled down again, the stainless steel fasteners may have a much lower preload than is required. In some cases, the preload may disappear nearly entirely, thereby resulting in a loose connection that may generate particulates and affect wafer processing uniformity.

Another issue that may occur with some fasteners, especially fasteners that have higher torque requirements, is that the showerhead faceplate may diffusion bond to the showerhead backplate at one or more locations of the planar thermal contact surfaces when held at elevated temperatures and under a high enough clamping load, such as may be encountered during steady-state operating conditions within the semiconductor processing chamber. Such diffusion bonding may, in effect, permanently or semi-permanently affix the showerhead faceplate to the showerhead backplate, even when the threaded fasteners that clamped the showerhead faceplate to the showerhead backplate are removed. This may either prevent the showerhead faceplate from being removed or, if the showerhead faceplate is still able to be removed, may cause damage to the planar thermal contact interfaces since bonded portions of the showerhead faceplate and/or the showerhead backplate may be, in essence, torn free from one or the other of those components.

Since the operating temperatures of such removable showerhead faceplates are not easily changed (being determined by the requirements of the semiconductor process for which the showerhead is being used), the primary mechanism for reducing the possibility of such diffusion bonding is to reduce the clamping force that is exerted across the showerhead faceplate/showerhead backplate interface. However, reducing the preload on the threaded fasteners (to reduce the clamping force) to the extent needed to prevent diffusion bonding at the clamping location results, in many cases, in a drastic reduction in that preload after thermal cycling has occurred, which will cause the bolted joints to loosen, reduce the thermal transmissivity across the bolted joint, and potentially result in gas leakage through the bolted joint. For example, a test was performed using a variety of 6-32 socket head cap screws (SHCS) to clamp together a showerhead faceplate and a showerhead backplate. The showerhead faceplate and the showerhead backplate were both made of aluminum alloy, e.g., 6061-T6, and the threaded holes in the showerhead faceplate that received the SHCSs were equipped with high-nickel alloy threaded inserts, e.g., helical inserts. Different configurations of threaded fasteners were used at different locations, including, for example, both aluminum alloy (6061-T6) SHCSs and high-nickel alloy SHCSs. Additionally, different load distribution mechanisms were tested with each SHCS, including, for example, the absence of such a load distribution mechanism (SHCS in direct contact with showerhead backplate), the use of a single flat washer in between the SHCS and the showerhead backplate, the use of a single conical spring washer in between the SHCS and the showerhead backplate, the use of a single conical spring washer and a single flat washer between the SHCS and the showerhead backplate, the use of two conical spring washers, both in series and in parallel, and a single flat washer in between the SHCS and the showerhead backplate, and the use of three conical spring washers in series and a single flat washer in between the SHCS and the showerhead backplate.

Conical spring washers, e.g., "Belleville" washers, are engineered so as to have upper and lower surfaces that are nested conical frustums. In a conical spring washer, for example, there may be an outer edge and an inner edge of the conical spring washer that are a) on opposite sides of the conical spring washer, b) further apart than the distance between the other inner edge and the other outer edge of that conical spring washer, and c) further apart than the normal distance between the top and bottom surfaces of such a conical spring washer. In such cases, when a compressive load is applied to those inner and outer edges along the centerline of the conical spring washer, the compressive load may cause the conical spring washer to elastically deform and start to flatten from a conical shape to a flat washer shape. Conical spring washers offer a relatively stiff spring in combination with a short travel distance.

It was discovered that using the high-nickel alloy SHCSs torqued to a value of 5 in-lb and using any of the above load-distribution mechanisms prevented diffusion bonding from occurring, but, in most cases, also experienced a significant loss of preload, e.g., greater than 50%, after being brought to the desired operating temperature of between 250° C. to 350° C. For clarity, high-nickel alloys are alloys where nickel is the element that is most prevalent in the composition of the alloy. Torqueing the high-nickel alloy SHCSs to a value higher than 5 in-lb, e.g., 6.5 in-lb, was found to mitigate the loss of preload under thermal cycling, but also resulted in a resurgence of the diffusion bonding issue. Utilizing more complicated conical spring washer arrangements, e.g., multiple conical spring washers in series, was also found to mitigate the loss of preload, but required additional components and presented increased opportunity for incorrect assembly since the additional conical spring washer(s) could be omitted or installed in the incorrect orientation. For clarity, conical spring washers in parallel are stacked such that the conical surfaces of the conical spring washers are nested and oriented in the same direction. Conical spring washers in series are stacked such that every other conical spring washer is oriented in the one direction and the other conical spring washers are oriented in the other direction (giving a "pleated" appearance when viewed from the side).

More satisfactory results were observed when using the aluminum alloy SHCSs, which were torqued to a value of approximately 4 in-lb; use of a single conical spring washer and a single flat washer with such SHCSs was found to result in over 80% of the preload being maintained, even after multiple thermal cycles. While more complicated conical washer implementations were not tested for the aluminum alloy SHCS, series implementations of conical spring washers may provide similarly acceptable preloading performance with such SHCSs. Comparable results were found for a similar test run with 10-24 SHCSs, which were used as first threaded fasteners in one implementation and were torqued to values of between 6 and 8 in-lbs, e.g., 7 in-lbs, to obtain the desired degree of preload.

The flat washers and the conical spring washers used were of a high-nickel alloy, e.g., Inconel, which was used due to its high strength and chemical resistance. The use of the flat washers in such joints may help distribute the edge load of the conical washers that are interposed between the flat washers and the SHCSs, thereby preventing the edges of the conical spring washers from directly contacting the material of the showerhead backplate. For showerhead backplates made of aluminum alloy, this may reduce the chance of galling or gouging of the showerhead backplate material (which may result in undesirable particulate generation) by the conical spring washer when it is compressed by tightening of the SHCS and expands radially.

The use of conical spring washers allows the for the preload that is applied to the joint to be primarily managed by the deformation of the conical spring washers as opposed to primarily through stretching of the SHCS, which, due to its much higher spring constant, requires little displacement in order to transition between an unpreloaded state and a significantly preloaded state. The conical spring washers, having a greater range of travel, may allow the preload to be maintained above a desired minimum for a greater range of potential displacement due to thermal expansion, thereby allowing adequate clamping force to be maintained to promote good thermal contact between the showerhead faceplate and the showerhead backplate while avoiding the potential for loosening of the showerhead faceplate/showerhead backplate interface during thermal cycling as well as the potential for undesired diffusion bonding of the showerhead faceplate and the showerhead backplate.

Figure 5:
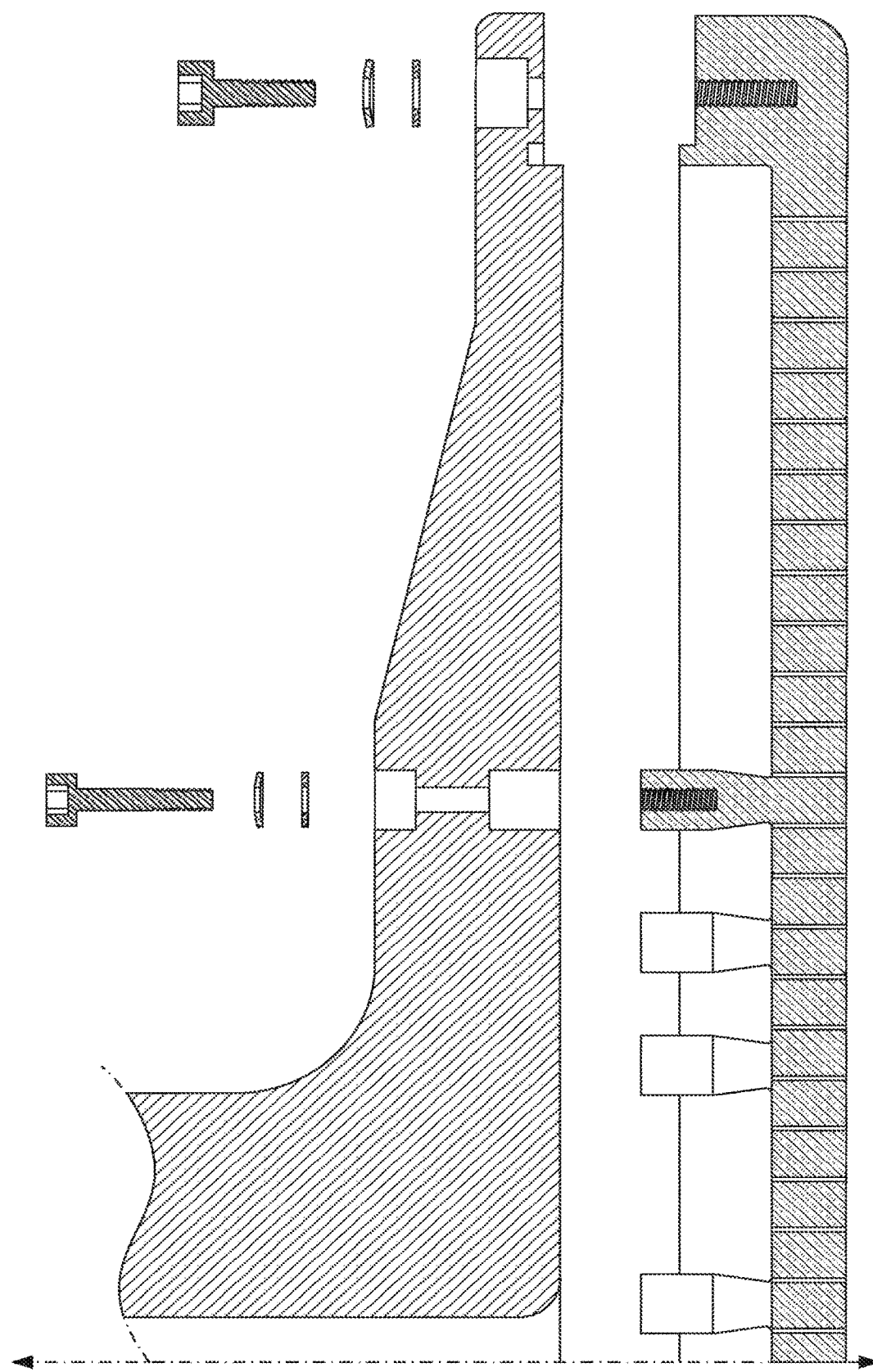
FIG. 5 depicts an exploded view of the example showerhead of FIG. 1.

FIG. 5 depicts an exploded view of the example showerhead of FIG. 1. As can be seen, each first threaded fastener 144 and second threaded fastener 146 is passed through first a conical spring washer 148 and then a flat washer 150 (or simply "washer") before being inserted through corresponding holes in the showerhead backplate 108 and threaded into the first threaded holes 140 and the second threaded holes 142, respectively.

It will be further appreciated that the number of first threaded fasteners used may be much higher than would generally be required for structural support of the showerhead faceplate 106. For example, six or eight threaded fasteners located around the outer perimeter of the showerhead 102 would typically be considered sufficient to structurally support the showerhead faceplate 106. However, in some implementations of a removable showerhead faceplate, a much larger number of such fasteners may be used. For example, it was found that increasing the number of threaded fasteners around the outer perimeter of the showerhead 102 resulted in a more evenly distributed load and thus more evenly distributed thermal contact paths for heat flow from the showerhead faceplate. In particular, the performance benefit was found to significantly outweigh the additional cost of having, for example, 18, 20, 22, 24, or more threaded fasteners arranged around the perimeter of the showerhead 102 to secure the showerhead faceplate to the showerhead backplate. The angular spacing between the threaded holes in the showerhead faceplate about the center axis of the showerhead in such implementations may thus be 20° or less.

In some implementations, some of the through-holes in the showerhead backplate #HH08 through which the threaded fasteners may be inserted before being threaded into the showerhead faceplate #HH06 may be specially configured to serve as faceplate removal features. For example, such through-holes may be threaded holes having an inner thread diameter that is larger than either the largest diameter of the threads of the threaded fasteners, or the shanks thereof, that are to be inserted therethrough and threaded into the threaded holes of the showerhead faceplate. This allows such holes to be used just like the other holes to provide a clamped connection between the showerhead faceplate and the showerhead backplate using the threaded fasteners. However, if the showerhead faceplate and the showerhead backplate later prove, after those threaded fasteners are removed, to be difficult to separate, a larger-sized threaded fastener that has a thread size that matches that of the threads provided for the threaded holes in the showerhead backplate may be threaded into such threaded holes until those fasteners bottom out against the showerhead faceplate. Additional torque applied to such larger fasteners may then cause the larger fasteners to push against the showerhead faceplate, forcing the showerhead faceplate to separate from the showerhead backplate.

The various structures discussed herein, e.g., removable showerhead faceplates, showerhead backplates, first threaded fasteners, second threaded fasteners, etc., may be made from a variety of different materials suitable for use in the harsh environments of semiconductor processing chambers during semiconductor processing operations. For example, as discussed above, aluminum alloys, such as 6061-T6, may be used for the showerhead faceplate, showerhead backplate, and the first and second threaded fasteners. Using similar materials in such components may reduce the amount of thermal expansion mismatch that may occur between such components, which may avoid scenarios where a component becomes highly stressed and potentially fails or otherwise behaves in an undesirable manner. However, some showerheads may use dissimilar materials for some or all of these components. For example, high-nickel alloy threaded fasteners may be used in some implementations featuring aluminum alloy showerhead faceplates and showerhead backplates. Other materials that may be used to provide the showerhead faceplates and showerhead backplates include ceramics, aluminum oxide, and other aluminum alloys.

The threaded fasteners, the conical spring washers, and the flat washers discussed above may be made from a variety of alloys, including high-nickel alloys such as Inconel, aluminum alloys such as 6061-T6, or other alloys. It may be beneficial to use materials in areas seeing high stress, e.g., the threaded joint interfaces and the washer loading/fastener loading areas, to avoid diffusion bonding across those interfaces. Thus, for example, the washers (both flat and conical) may be made, in some implementations, from a high-nickel alloy while the showerhead faceplate and backplate may be made from an aluminum alloy.

Figure 6:
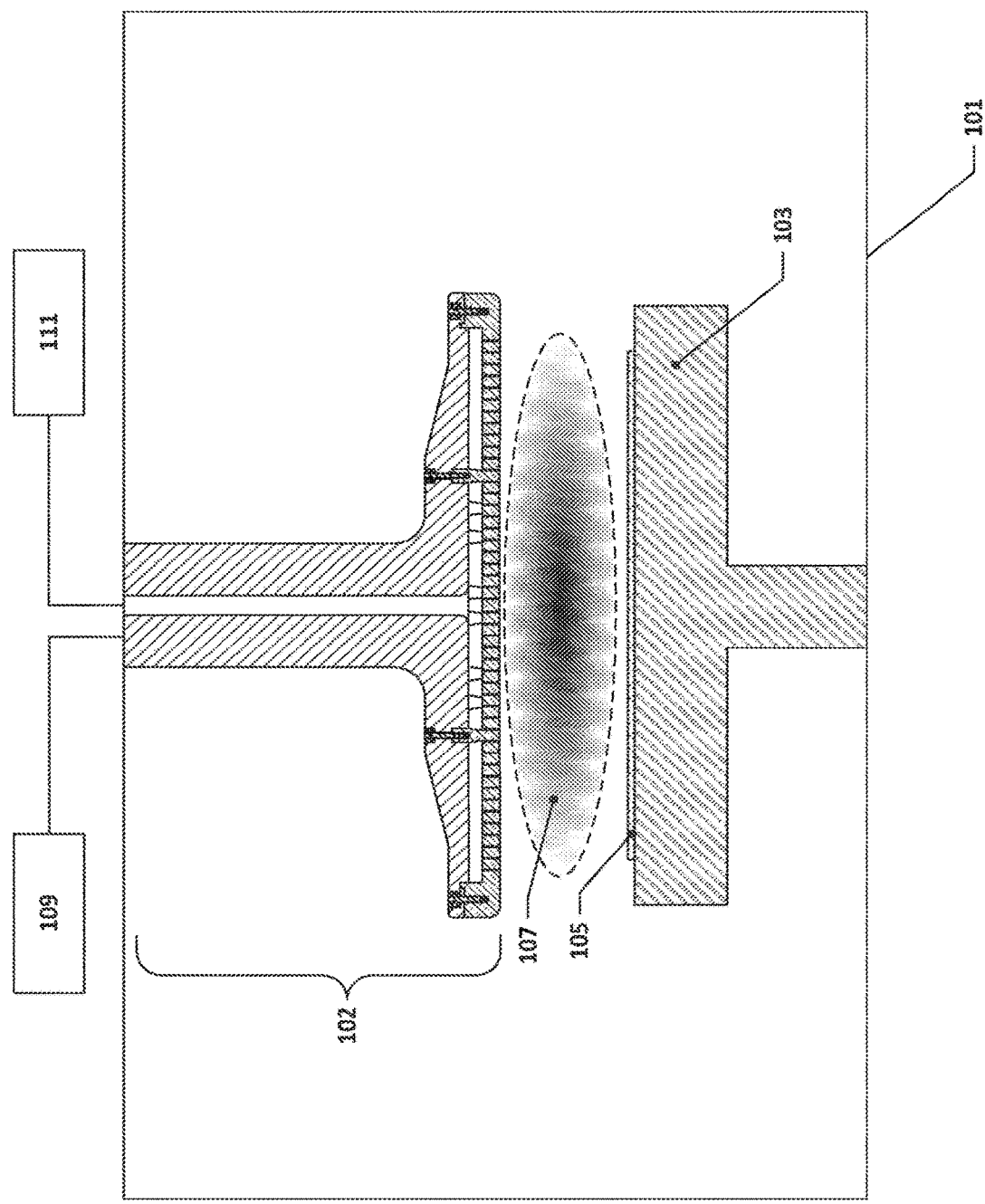
FIG. 6 depicts a diagram of a semiconductor processing system according to the present disclosure.

It will be understood that the showerheads discussed herein may be used in a semiconductor processing tool, e.g., equipment configured with one or more semiconductor processing chambers that are configured to receive semiconductor wafers or other substrates and performing one or more semiconductor processing operations thereupon. FIG. 6 depicts a diagram of an example semiconductor processing system according to the present disclosure. In FIG. 6, a semiconductor processing chamber 101 is shown that includes within it a wafer support 103 that is configured to support a wafer 105 during processing operations. The processing chamber 101 may further include a showerhead 102, as discussed herein, which may be fluidically connected with one or more process gas sources 111. In some implementations, the showerhead 102 may be configured to act as an electrode used to spark and/or maintain a plasma 107 that may be generated above the wafer 105. In such implementations, the showerhead 102 may be electrically connected, for example, with a radio-frequency generator 109.

It is to be understood that the phrases "for each <item> of the one or more <items>," "each <item> of the one or more <items>," or the like, if used herein, are inclusive of both a single-item group and multiple-item groups, i.e., the phrase "for . . . each" is used in the sense that it is used in programming languages to refer to each item of whatever population of items is referenced. For example, if the population of items referenced is a single item, then "each" would refer to only that single item (despite the fact that dictionary definitions of "each" frequently define the term to refer to "every one of two or more things") and would not imply that there must be at least two of those items. Similarly, the term "set" or "subset" should not be viewed, in itself, as necessarily encompassing a plurality of items—it will be understood that a set or a subset can encompass only one member or multiple members (unless the context indicates otherwise).

The use, if any, of ordinal indicators, e.g., (a), (b), (c) . . . or the like, in this disclosure and claims is to be understood as not conveying any particular order or sequence, except to the extent that such an order or sequence is explicitly indicated. For example, if there are three steps labeled (i), (ii), and (iii), it is to be understood that these steps may be performed in any order (or even concurrently, if not otherwise contraindicated) unless indicated otherwise. For example, if step (ii) involves the handling of an element that is created in step (i), then step (ii) may be viewed as happening at some point after step (i). Similarly, if step (i) involves the handling of an element that is created in step (ii), the reverse is to be understood.

Terms such as "about," "approximately," "substantially," "nominal," or the like, when used in reference to quantities or similar quantifiable properties, are to be understood to be inclusive of values within ±10% of the values or relationship specified (as well as inclusive of the actual values or relationship specified), unless otherwise indicated.

It should be appreciated that all combinations of the foregoing concepts (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

It is to be further understood that the above disclosure, while focusing on a particular example implementation or implementations, is not limited to only the discussed example, but may also apply to similar variants and mechanisms as well, and such similar variants and mechanisms are also considered to be within the scope of this disclosure.

What is claimed is:

1. An apparatus comprising:
a showerhead faceplate, wherein:
the showerhead faceplate is configured to removably mate with a showerhead backplate,
the showerhead faceplate has a plate region having a plurality of gas distribution ports located therein,
each gas distribution port extends through the showerhead faceplate,
the showerhead faceplate includes one or more first planar thermal contact surfaces, each first planar thermal contact surface configured to contact a corresponding second planar thermal contact surface on the showerhead backplate when the showerhead faceplate is mated to the showerhead backplate,
the one or more first planar thermal contact surfaces include an annular planar thermal contact surface that has an outer diameter of between 12" and 18" and that encircles the plate region when viewed along a first axis that is perpendicular to the annular planar thermal contact surface, and
the annular planar thermal contact surface has a flatness less than or equal to a value between 800 μin and 1200 μin and a surface roughness Ra less than or equal to a value between 24 μin to 40 μin.

2. The apparatus of claim 1, further including a plurality of posts located within the plate region and extending away from the plate region, wherein the one or more first planar thermal contact surfaces includes, for each of the posts, an endpost thermal contact surface that is parallel to the annular planar thermal contact surface.

3. The apparatus of claim 2, wherein the first planar thermal contact surfaces have flatness values less than or equal to 1000 μin and average surface roughness Ra greater than or equal to 24 μin.

4. The apparatus of claim 2, wherein the first planar thermal contact surfaces have flatness values less than or equal to 1000 μin and average surface roughness Ra greater than or equal to 30 μin.

5. The apparatus of claim 2, wherein the first planar thermal contact surfaces have flatness values less than or equal to 1000 μin and average surface roughness Ra equal to 40 μin.

6. The apparatus of claim 1, wherein the showerhead faceplate is made of an aluminum alloy.

7. The apparatus of claim 1, wherein:
the showerhead faceplate includes a plurality of first threaded holes distributed around the plate region and located in the annular planar thermal contact surface.

8. The apparatus of claim 7, wherein:
the first threaded holes are arranged in a circular array with an angular spacing of at most 20° in between adjacent first threaded holes.

9. The apparatus of claim 7, wherein:
the showerhead faceplate further includes a first thermal interference fit feature that is configured to interface with a second thermal interference fit feature on the showerhead backplate when the showerhead faceplate is mated to the showerhead backplate,
the first thermal interference fit feature includes a first axially symmetric surface that faces radially outwards and is located in between the plate region and the first threaded holes, and
the first axially symmetric surface has a first cross-sectional profile that is dimensioned so as to be within 0.01" to 0.014" of a corresponding second cross-sectional profile of the second thermal interference fit feature on the showerhead backplate when the showerhead faceplate is mated to the showerhead backplate such that the showerhead faceplate is centered with respect to the showerhead backplate and the showerhead faceplate and the showerhead backplate are both at 20° C.

10. The apparatus of claim 9, wherein:
the first thermal interference fit feature is a first cylindrical surface having a first diameter,
the second thermal interference fit feature on the showerhead backplate with which the first thermal interference fit feature is configured to interface when the showerhead faceplate is mounted to the showerhead backplate is a second cylindrical surface having a second diameter, and
the first diameter is smaller than the second diameter and within 0.02" of the second diameter when the showerhead faceplate and the showerhead backplate are both at 20° C.

11. The apparatus of claim 10, wherein:
the showerhead faceplate includes an inner wall that extends around the plate region and is interposed between the first threaded holes and the plate region,
the inner wall extends away from the annular planar thermal contact surface, and
the first thermal interference fit feature is provided by an outward-facing surface of the inner wall.

12. The apparatus of claim 9, further comprising:
a plurality of first threaded fasteners equal in number to the number of first threaded holes;
a plurality of washers at least equal in number to the number of first threaded holes; and
a plurality of conical spring washers at least equal in number to the number of first threaded holes, wherein the apparatus is a kit configured to facilitate replacement of an expired showerhead faceplate attached to the showerhead backplate of a semiconductor processing tool.

13. The apparatus of claim 12, wherein:
the showerhead faceplate is made of a first material,
the first threaded fasteners are made of a second material,
the conical spring washers are made of a first alloy,
the washers are made of a second alloy,
the first material and the second material are each selected from the group consisting of: an aluminum alloy, 6061-T6 aluminum alloy, and alumina,
the first alloy and the second alloy are each selected from the group consisting of: a nickel alloy, an aluminum alloy, and 6061-T6 aluminum alloy,
the second material is selected from the group consisting of the first material and a material other than the first material, and
the second alloy is selected from the group consisting of the first alloy and an alloy other than the first alloy.

14. The apparatus of claim 9, further comprising:
the showerhead backplate having a plurality of through-holes equal in number to the number of first threaded holes;
a plurality of first threaded fasteners equal in number to the number of first threaded holes;
a plurality of washers at least equal in number to the number of first threaded holes; and
a plurality of conical spring washers at least equal in number to the number of first threaded holes, wherein:

each first threaded fastener of the plurality of first threaded fasteners is inserted through at least one of the washers, one of the conical spring washers, one of the through-holes, and screwed into a corresponding one of the first threaded holes, and at least one washer is interposed between each of the conical spring washers and the showerhead backplate.

15. The apparatus of claim 14, wherein:
one or more of the through-holes in the showerhead backplate are threaded holes having an inner thread diameter large enough that the first threaded fastener inserted therethrough is able to be inserted therethrough without engagement of the threads of the first threaded fastener with the threads of the threaded hole.

16. The apparatus of claim 14, wherein:
the showerhead faceplate is made of a first material,
the showerhead backplate is made of a second material,
the threaded fasteners are made of a third material,
the conical spring washers are made of a first alloy,
the washers are made of a second alloy,
the first material, the second material, and the third material are each selected from the group consisting of: an aluminum alloy, 6061-T6 aluminum alloy, and alumina,
the first alloy and the second alloy are each selected from the group consisting of: a nickel alloy, an aluminum alloy, and 6061-T6 aluminum alloy,
the second material is selected from the group consisting of the first material, the third material, and a material other than the first material and the third material,
the third material is selected from the group consisting of the first material, the second material, and a material other than the first material and the second material, and
the second alloy is selected from the group consisting of the first alloy and an alloy other than the first alloy.

17. The apparatus of claim 14, wherein each first threaded fastener is torqued to between 6 inch-pounds and 8 inch-pounds.

* * * * *